(12) United States Patent
Na et al.

(10) Patent No.: US 10,825,840 B2
(45) Date of Patent: Nov. 3, 2020

(54) THIN-FILM TRANSISTOR PANEL

(71) Applicant: SAMSUNG DISPLAY CO., LTD., Yongin (KR)

(72) Inventors: Byoung-Sun Na, Seoul (KR); Ju-Hee Lee, Asan-si (KR); Won-Hee Lee, Seoul (KR); Ho-Kyoon Kwon, Seoul (KR)

(73) Assignee: Samsung Display Co., Ltd.

( * ) Notice: Subject to any disclaimer, the term of this patent is extended or adjusted under 35 U.S.C. 154(b) by 0 days.

(21) Appl. No.: 15/061,291

(22) Filed: Mar. 4, 2016

(65) Prior Publication Data

US 2016/0190167 A1 Jun. 30, 2016

Related U.S. Application Data

(62) Division of application No. 12/607,028, filed on Oct. 27, 2009, now abandoned.

(30) Foreign Application Priority Data

Feb. 18, 2009 (KR) ........................ 10-2009-0013543

(51) Int. Cl.
*H01L 27/12* (2006.01)
*H01L 29/786* (2006.01)
(Continued)

(52) U.S. Cl.
CPC ........ *H01L 27/124* (2013.01); *G02F 1/13624* (2013.01); *G02F 1/136209* (2013.01);
(Continued)

(58) Field of Classification Search
CPC ......... G02F 1/133512; G02F 1/136209; G02F 2001/1351; H01L 27/12–13
See application file for complete search history.

(56) References Cited

U.S. PATENT DOCUMENTS 6,919,942 B2 * 7/2005 Aoki ................. G02F 1/136209
349/111
6,937,209 B1 8/2005 Nagata et al.
(Continued)

FOREIGN PATENT DOCUMENTS

JP WO 2008108042 A1 * 9/2008 ........... G06F 3/0414
KR 10-2007-0015982 2/2007
(Continued)

OTHER PUBLICATIONS

Definition of "overlap", dictionary.reference.com/browse/overlap, Sep. 19, 2012, 1 page.
(Continued)

*Primary Examiner* — Patrick F Marinelli
(74) *Attorney, Agent, or Firm* — Innovation Counsel LLP

(57) ABSTRACT

Embodiments of the present disclosure provide a thin-film transistor (TFT) panel structured to prevent the deterioration of image quality due to the luminance change of backlight. According to an embodiment, the TFT panel includes: an insulating substrate; a first gate line and a first data line which are formed on the insulating substrate to be insulated from each other and cross each other; a first subpixel electrode which is formed on the insulating substrate and connected to the first gate line and the first data line by a first TFT; a second subpixel electrode which is formed on the insulating substrate and separated from the first subpixel electrode; a connecting electrode which is directly connected to any one of the first and second subpixel electrodes and capacitively coupled to the other one of the first and second subpixel electrodes; a semiconductor pattern which is formed between the connecting electrode and the insulating substrate; and a light-shielding pattern which is formed between the semiconductor pattern and the insulating sub-
(Continued)

strate, is overlapped by the connecting electrode, and blocks light.

2 Claims, 10 Drawing Sheets

(51) Int. Cl.
  *G02F 1/1362* (2006.01)
  *G02F 1/1343* (2006.01)
  *G02F 1/1335* (2006.01)

(52) U.S. Cl.
  CPC ...... *H01L 27/1218* (2013.01); *H01L 27/1255* (2013.01); *H01L 27/1288* (2013.01); *H01L 29/78633* (2013.01); *H01L 29/78669* (2013.01); *H01L 29/78678* (2013.01); *G02F 1/133512* (2013.01); *G02F 2001/134345* (2013.01)

(56) References Cited

U.S. PATENT DOCUMENTS

| | | | | |
|---|---|---|---|---|
| 7,518,688 | B2* | 4/2009 | Chen | G02F 1/13439 |
| | | | | 349/130 |
| 8,610,867 | B2* | 12/2013 | Kim | C09K 19/02 |
| | | | | 349/144 |
| 8,842,231 | B2* | 9/2014 | Liu | H01L 27/1214 |
| | | | | 349/46 |
| 8,964,153 | B2* | 2/2015 | Paik | G02F 1/136209 |
| | | | | 349/110 |
| 9,389,470 | B1* | 7/2016 | Tien | G02F 1/136209 |
| 2003/0178628 | A1* | 9/2003 | Aoki | G02F 1/136209 |
| | | | | 257/83 |
| 2005/0112790 | A1* | 5/2005 | Lan | G02F 1/13458 |
| | | | | 438/30 |
| 2005/0151921 | A1 | 7/2005 | Okamoto | |
| 2005/0230719 | A1* | 10/2005 | Aoki | G02F 1/136209 |
| | | | | 257/291 |
| 2006/0244890 | A1* | 11/2006 | Chen | G02F 1/13439 |
| | | | | 349/144 |
| 2007/0007525 | A1* | 1/2007 | Ahn | G02F 1/134336 |
| | | | | 257/59 |
| 2007/0013633 | A1* | 1/2007 | Kamada | G02F 1/1362 |
| | | | | 345/98 |
| 2008/0036933 | A1 | 2/2008 | Na et al. | |
| 2008/0136992 | A1 | 6/2008 | Kim | |
| 2008/0225218 | A1 | 9/2008 | Lee et al. | |
| 2009/0086144 | A1 | 4/2009 | Chen et al. | |
| 2009/0185091 | A1* | 7/2009 | Kim | C09K 19/02 |
| | | | | 349/39 |
| 2010/0013785 | A1* | 1/2010 | Murai | G06F 3/047 |
| | | | | 345/173 |
| 2010/0045906 | A1 | 2/2010 | Tokuda et al. | |
| 2010/0097359 | A1 | 4/2010 | Yamada et al. | |
| 2010/0097546 | A1* | 4/2010 | Chang | G02F 1/136209 |
| | | | | 349/111 |
| 2010/0207846 | A1* | 8/2010 | Na | H01L 27/124 |
| | | | | 345/55 |
| 2011/0109609 | A1* | 5/2011 | Jeong | H01L 31/1136 |
| | | | | 345/211 |
| 2011/0241006 | A1* | 10/2011 | Mitani | H01L 29/78633 |
| | | | | 257/59 |

FOREIGN PATENT DOCUMENTS

| | | |
|---|---|---|
| KR | 10-2008-0038590 | 5/2008 |
| KR | 10-2008-0045961 | 5/2008 |
| KR | 10-2008-0056493 | 6/2008 |
| KR | 10-2008-0083811 | 9/2008 |

OTHER PUBLICATIONS

Definition of "pattern", www.thefreedictionary.com/pattern, Sep. 19, 2012, 1 page.

* cited by examiner

THIN-FILM TRANSISTOR PANEL

This application is a divisional application of U.S. patent application Ser. No. 12/607,028 filed on Oct. 27, 2009, which claims priority to and benefit from Korean Patent Application No. 10-2009-0013543 filed on Feb. 18, 2009 in the Korean Intellectual Property Office, the disclosure of which is incorporated herein by reference in its entirety.

BACKGROUND

1. Technical Field

Embodiments of the present invention generally relate to a thin-film transistor (TFT) panel, and more particularly, to a TFT panel structured to prevent the deterioration of image quality due to the luminance change of backlight.

2. Description of the Related Art

As modern society becomes more dependent on sophisticated information and communication technology, the market needs for larger and thinner displays are growing. In particular, since conventional cathode ray tubes (CRTs) have failed to fully satisfy these market needs, the demand for flat panel displays (FPDs), such as plasma display panels (PDPs), plasma address liquid crystal display panels (PALCs), liquid crystal displays (LCDs), and organic light emitting diodes (OLEDs), is exploding.

LCDs are one of the most widely used types of FPDs. Generally, an LCD includes a pair of display panels having electrodes and a liquid crystal layer interposed between the display panels. In an LCD, voltages are applied to electrodes to generate an electric field. Accordingly, the alignment of liquid crystal molecules of a liquid crystal layer is determined, and polarization of incident light is controlled. As a result, a desired image is displayed on the LCD.

A TFT panel having a TFT array is fabricated by a process using, typically, three to five masks. In a TFT panel fabricated by a process using four masks, a semiconductor layer, a source electrode, a drain electrode, and a data electrode overlap each other and have the same shape.

Here, the semiconductor layer tends to become conductive when exposed to light from a backlight assembly, thereby forming a capacitor with a neighboring conductor.

In particular, if an alternating current (AC) voltage is applied to the backlight assembly, the backlight assembly is repeatedly powered on and off. Accordingly, the semiconductor layer repeatedly changes between a conductor and a nonconductor. This causes coupling between the pixel electrode and the semiconductor layer, which, in turn, deteriorates image quality.

SUMMARY

Embodiments of the present invention provide a thin-film transistor (TFT) panel structured to prevent the deterioration of image quality due to the luminance change of backlight.

However, embodiments of the present invention are not restricted to the ones set forth herein. The above and other aspects of the embodiments of the present invention will become more apparent to one of ordinary skill in the art to which the present disclosure pertains by referencing the detailed description of the present disclosure given below.

According to an embodiment of the present invention, there is provided a TFT panel including: an insulating substrate; a first gate line and a first data line which are formed on the insulating substrate to be insulated from each other and cross each other; a first subpixel electrode which is formed on the insulating substrate and connected to the first gate line and the first data line by a first TFT; a second subpixel electrode which is formed on the insulating substrate and separated from the first subpixel electrode; a connecting electrode which is directly connected to any one of the first and second subpixel electrodes and capacitively coupled to the other one of the first and second subpixel electrodes; a semiconductor pattern which is formed between the connecting electrode and the insulating substrate; and a light-shielding pattern which is formed between the semiconductor pattern and the insulating substrate, is overlapped by the connecting electrode, and blocks light.

According to another embodiment of the present invention, there is provided a TFT panel including: an insulating substrate; a gate line and a data line which are formed on the insulating substrate to be insulated from each other and cross each other; a pixel electrode which is formed on the insulating substrate and connected to the gate line and the data line by a TFT; a connecting electrode which connects the TFT to the pixel electrode; a semiconductor pattern which is formed between the connecting electrode and the insulating substrate; and a light-shielding pattern which is formed between the semiconductor pattern and the insulating substrate, is overlapped by the connecting electrode, and blocks light.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION

Figure 1:
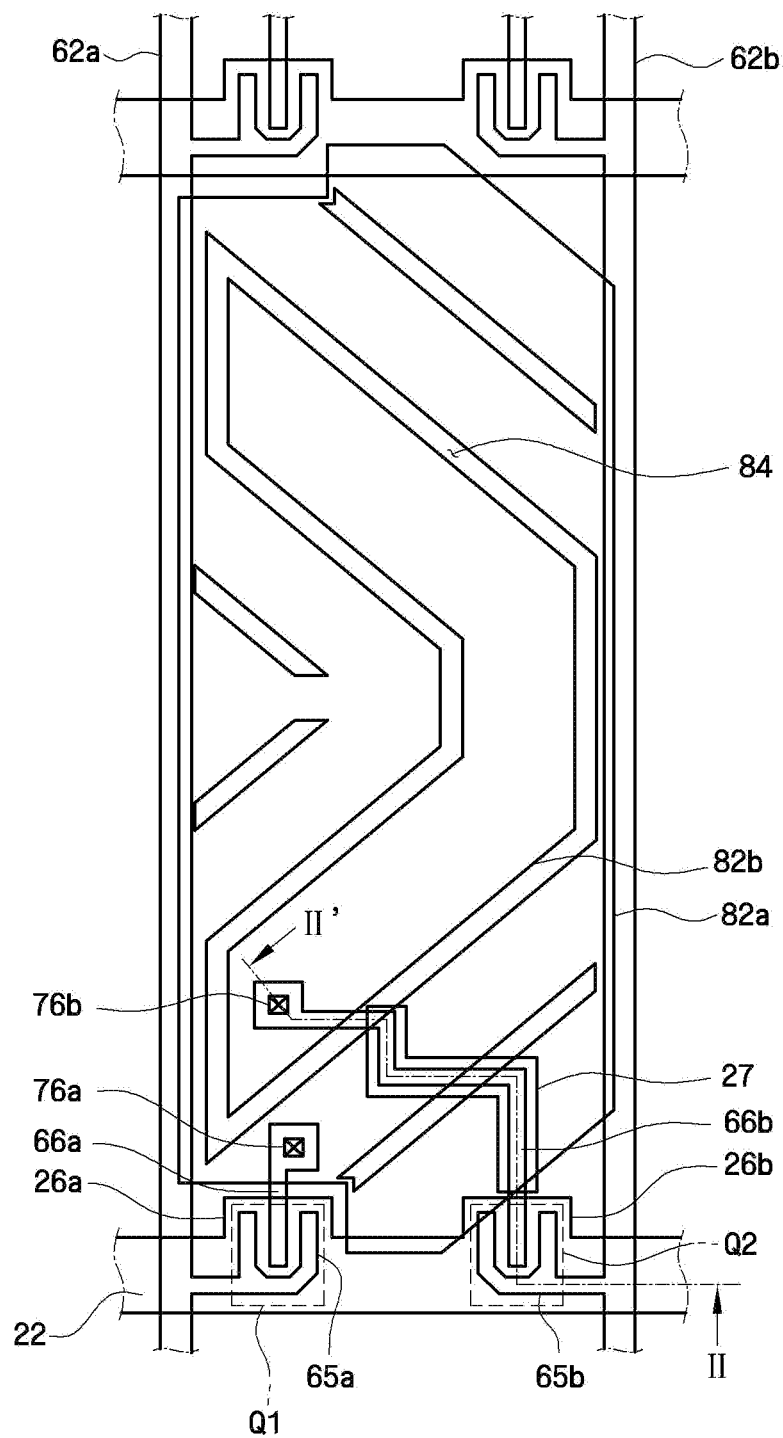
FIG. 1 is a layout diagram of a display device including a thin-film transistor (TFT) panel according to a first embodiment of the present invention.

Advantages and features of the present disclosure and methods of accomplishing the same may be understood more readily by reference to the following detailed description of exemplary embodiments and the accompanying drawings. The present disclosure may, however, be embodied in many different forms and should not be construed as being limited to the embodiments set forth herein. Rather, these embodiments are provided so that this disclosure will be thorough and complete and will fully convey the concept of the disclosure to those skilled in the art, and the present disclosure will only be defined by the appended claims.

Spatially relative terms, such as "below", "beneath", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. Like reference numerals refer to like elements throughout the specification.

Figure 2:
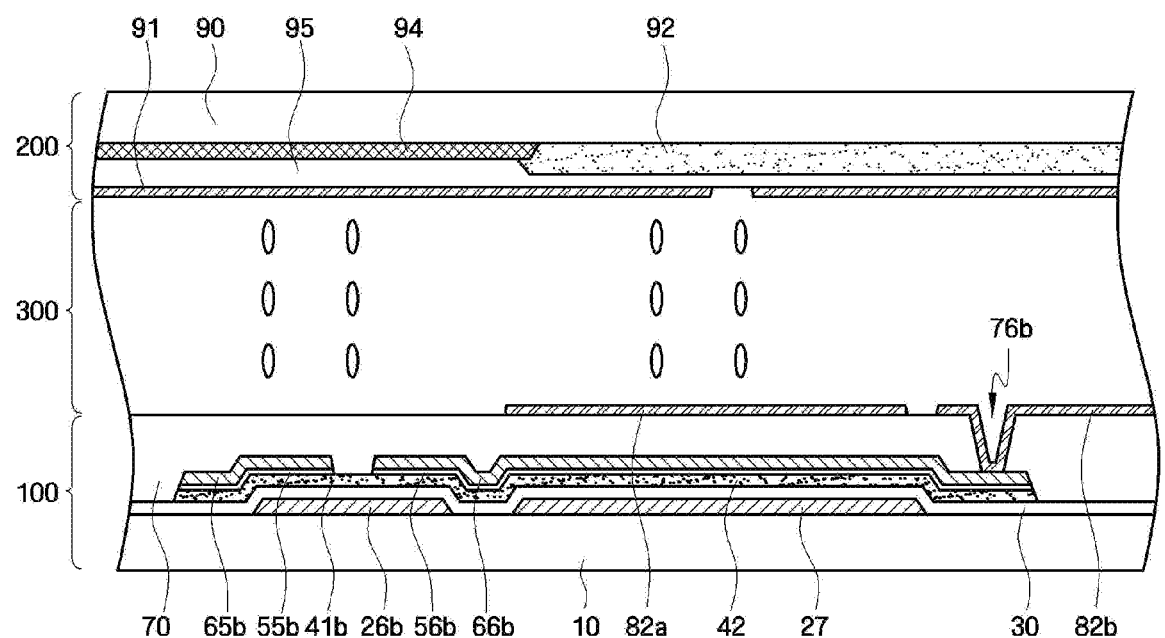
FIG. 2 is a cross-sectional view of the display device taken along the line I-II' of FIG. 1 according to an embodiment.

Hereinafter, a thin-film transistor (TFT) panel 100 according to a first embodiment of the present invention will be described in detail with reference to FIGS. 1 through 2. FIG. 1 is a layout diagram of a display device including the TFT panel 100 according to the first embodiment of the present invention. FIG. 2 is a cross-sectional view of the display device taken along the line I-II' of FIG. 1 according to an embodiment.

Referring to FIGS. 1 and 2, a gate line 22 is formed on a first insulating substrate 10, which may be made of transparent glass. The gate line 22 generally extends in a horizontal direction and delivers a gate signal. One gate line 22 is allocated to each pixel. A first gate electrode 26a and a second gate electrode 26b protrude from the gate line 22. The first gate electrode 26a and the second gate electrode 26b form respective gate terminals of a first TFT Q1 and a second TFT Q2, respectively. The gate line 22 and the first and second gate electrodes 26a and 26b are referred to as gate wirings.

The gate wirings may be formed of aluminum (Al)-based metal, such as aluminum and an aluminum alloy, silver (Ag)-based metal, such as silver and a silver alloy, copper (Cu)-based metal such as copper and a copper alloy, molybdenum (Mo)-based metal, such as molybdenum and a molybdenum alloy, chrome (Cr), titanium (Ti) or tantalum (Ta).

In addition, the gate wirings may have a multi-film structure composed of two conductive films (not shown) with different physical characteristics. One of the two conductive films may be formed of metal with low resistivity, such as aluminum-based metal, silver-based metal or copper-based metal, in order to reduce a signal delay or a voltage drop of the gate wirings. The other one of the conductive films may be formed of a different material, in particular, a material having superior contact characteristics with indium tin oxide (ITO) and indium zinc oxide (IZO), such as molybdenum-based metal, chrome, titanium, or tantalum. Examples of multi-film structures include a chrome lower film and an aluminum upper film and an aluminum lower film and a molybdenum upper film. However, embodiments of the present invention are not limited thereto. The gate wirings may be formed of various metals and conductors.

A light-shielding pattern 27 is formed on the first insulating substrate 10. The light-shielding pattern 27 blocks light emitted from a backlight assembly (not shown), which is disposed under the TFT panel 100. The light-shielding pattern 27 may be formed in the same plane as the gate line 22. In addition, the light-shielding pattern 27 and the gate line 22 may be formed of the same material by the same process. The light-shielding pattern 27 will be described in more detail below.

A gate insulating film 30, which may be made of silicon nitride (SiNx), is disposed on the gate line 22 and the light-shielding pattern 27.

A first active layer (not shown) and a second active layer 41b are disposed on the gate insulating film 30 and are made of hydrogenated amorphous silicon or polycrystalline silicon. The first active layer (not shown) and the second active layer 41b overlap the first gate electrode 26a and the second gate electrode 26b, respectively.

Ohmic contact layers 55b and 56b are disposed on the first active layer (not shown) and the second active layer 41b and may be made of a material such as silicide or n+ hydrogenated amorphous silicon doped with n-type impurities in high concentration. The ohmic contact layers 55b and 56b form a pair and are disposed accordingly on the first active layer (not shown) and the second active layer 41b.

A first data line 62a and a second data line 62b and a first drain electrode 66a and a second drain electrode 66b, which correspond to the first and second data lines 62a and 62b, respectively, are formed on the ohmic contact layers 55b and 56b.

The first data line 62a and the second data line 62b extend in a vertical direction to be parallel to each other and cross the gate line 22. The first and second data lines 62a and 62b deliver data voltages to a first subpixel electrode 82a and a second subpixel electrode 82b. The gate line 22 is insulated from the first and second data lines 62a and 62b by the gate insulating film 30.

First and second source electrodes 65a and 65b branch off from the first and second data lines 62a and 62b, respectively. The first and second data lines 62a and 62b, the first and second source electrodes 65a and 65b, and the first and second drain electrodes 66a and 66b are referred to as data wirings.

The data wirings may be made of chrome, molybdenum-based metal, or refractory metal such as tantalum or titanium. In addition, the data wirings may have a multi-film structure (not shown) composed of a lower film (not shown), which is made of refractory metal, and an upper film (not shown), which is made of a material with low resistivity and is disposed on the lower film. Examples of multi-film structures include a chrome lower film and an aluminum upper film and an aluminum lower film and a molybdenum upper film. Alternatively, the multi-film structure may be a three-film structure having molybdenum-aluminum-molybdenum films.

The data wirings overlap a semiconductor pattern 42. The semiconductor pattern 42 may be made of hydrogenated amorphous silicon or polycrystalline silicon. Portions of the semiconductor pattern 42 form the first active layer (not shown) and the second active layer 41b described above. The first active layer (not shown) is overlapped by the first source electrode 65a and the first drain electrode 66a and forms a channel between the first source electrode 65a and the first drain electrode 66a. The second active layer 41b is overlapped by the second source electrode 65b and the second drain electrode 66b and forms a channel between the second source electrode 65b and the second drain electrode 66b.

A passivation layer 70 is formed on the data wirings and exposed portions of the first active layer (not shown) and the second active layer 41b. The passivation layer 70 may be made of an inorganic material such as silicon nitride or silicon oxide, an organic material having photosensitivity and superior planarization characteristics, or a low-k dielectric material formed by plasma enhanced chemical vapor deposition (PECVD), such as a-Si:C:O or a-Si:O:F. The passivation layer 70 may be composed of a lower inorganic film and an upper organic film in order to protect the exposed portions of the first active layer (not shown) and the second active layer 41b while taking advantage of the superior characteristics of the organic film. Furthermore, a red, green or blue color filter layer may be used as the passivation layer 70.

Contact holes 76a and 76b are formed in the passivation layer 70. A first subpixel electrode 82a and a second subpixel electrode 82b, which are made of transparent electrodes such as ITO or IZO, are disposed on the passivation layer 70.

The first subpixel electrode 82a is connected to the gate line 22 and the first data line 62a by the first TFT Q1 and receives a first data voltage. The second subpixel electrode 82b is connected to the gate line 22 and the second data line 62b by the second TFT Q2 and receives a second data voltage. Here, the first data voltage may be relatively lower than a common voltage, and the second data voltage may be relatively higher than the common voltage.

The second subpixel electrode 82b may be shaped like a "V" rotated 90 degrees in a counter-clockwise direction. The second subpixel electrode 82b may be surrounded by the first subpixel electrode 82a. The first subpixel electrode 82a is separated from the second subpixel electrode 82b by a slit pattern 84. The slit pattern 84 may be approximately 45 or −45 degrees with respect to the gate line 22.

The second subpixel electrode 82b may be connected to the second TFT Q2 by a connecting electrode. An end of the connecting electrode is connected to the second subpixel electrode 82b by the contact hole 76b, and the other end thereof forms the second drain electrode 66b of the second TFT Q2. That is, the connecting electrode and the second drain electrode 66b may be formed as a single body. Thus, while the connecting electrode may be understood to be a separate electrode, it may be substantially the same electrode as the second drain electrode 66b as shown in the embodiments of FIGS. 1 and 2.

The connecting electrode is directly connected to the second subpixel electrode 82b. In addition, the connecting electrode and the first subpixel electrode 82a overlap each other and thus are capacitively coupled to each other. The semiconductor pattern 42 is formed between the connecting electrode and the first insulating substrate 10. Also, the light-shielding pattern 27 is formed between the semiconductor pattern 42 and the first insulating substrate 10. That is, the light-shielding pattern 27 may be overlapped by the connecting electrode and may be formed in a region overlapped by the first subpixel electrode 82a. The light-shielding pattern 27 may not be formed under a portion of the connecting electrode which is not overlapped by the first subpixel electrode 82a. The light-shielding pattern 27 may be approximately 0 to 10 μm wider than the semiconductor pattern 42.

The light-shielding pattern 27 may float, or a direct current (DC) voltage may be applied to the light-shielding pattern 27. If the light-shielding pattern 27 floats or if the DC voltage is applied to the light-shielding pattern 27, a voltage charged in the first subpixel electrode 82a, which overlaps the light-shielding pattern 27, may be maintained at a predetermined level.

Since the light-shielding pattern 27 is formed in a region overlapped by the connecting electrode, it may prevent the semiconductor pattern 42 from becoming conductive due to light emitted from the backlight assembly (not shown). Without the light-shielding pattern 27, light emitted from the backlight assembly may cause the semiconductor pattern 42 to become conductive. In this case, if power supplied to the backlight assembly is alternating current (AC) power, the backlight assembly may emit light with different luminance values. Accordingly, the semiconductor pattern 42 may repeatedly change between a conductor and a nonconductor. Here, the first subpixel electrode 82a and the semiconductor pattern 42 are capacitively coupled to each other. As the semiconductor pattern 42 repeatedly changes between a conductor and a nonconductor, the capacitance between the semiconductor pattern 42 and the first subpixel electrode 82a may change, thereby affecting the first and second subpixel electrodes 82a and 82b. Consequently, image quality defects may be generated.

By forming the light-shielding pattern 27 so that it is not to be overlapped by the first and second data lines 62a and 62, but is to be overlapped by the connecting electrode, a transmission loss can be reduced to less than 1.5%.

When the light-shielding pattern 27 is not formed, the variation in the voltage of the first and second subpixel electrodes 82a and 82b due to backlight is approximately 48 mV. When the light-shielding pattern 27 is formed, the variation in the voltage of the first and second subpixel electrodes 82a and 82b is almost 0 mV.

Hereinafter, an upper panel 200 will be described in detail according to one or more embodiments. A black matrix 94 for preventing leakage of light and defining a pixel region is formed on a second insulating substrate 90, which may be made of transparent glass. Here, the black matrix 94 may be disposed in a region defined by the gate line 22, the first and second data lines 62a and 62b, and a TFT. The black matrix 94 may made of metal (metal oxide), such as chrome or chrome oxide, or organic black resist.

In addition, red, green and blue color filters 92 may be sequentially arranged in the pixel region between the black matrices 94.

An overcoat layer 95 may be formed on the color filters 92 to planarize their step heights.

A common electrode 91 is disposed on the overcoat layer 95 and may be made of a transparent conductive material such as ITO or IZO. The common electrode 91 faces the first and second subpixel electrodes 82a and 82b, and a liquid crystal layer 300 is interposed between the common electrode 91 and the first and second subpixel electrodes 82a and 82b.

If the TFT panel 100 and the upper panel 200 structured as described above according to one or more embodiments are aligned and coupled to each other and if the liquid crystal layer 300 is formed between the TFT panel 100 and the upper panel 200 by injecting a liquid crystal material therebetween, the basic structure of the display device is completed.

Figure 3:
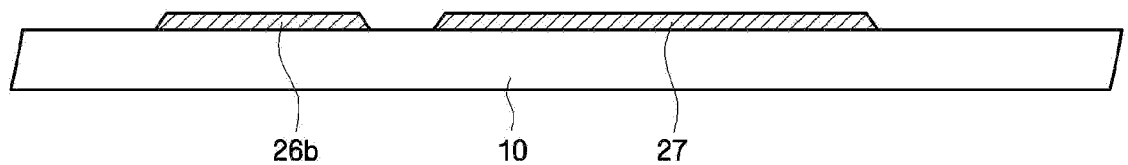
FIGS. 3 through 12 are cross-sectional views for sequentially explaining processes included in a method of fabricating the TFT panel according to the first embodiment of the present invention.

Hereinafter, a method of fabricating the TFT panel 100 according to the first embodiment of the present invention will be described in detail. FIGS. 3 through 12 are cross-sectional views for sequentially explaining processes included in the method of fabricating the TFT panel 100 according to the first embodiment of the present invention. Referring to FIGS. 1 and 3, a gate conductive layer is stacked on the first insulating substrate 10 and then patterned to form the gate line 22, the first gate electrode 26a, the second gate electrode 26b, and the light-shielding pattern 27. Here, the gate conductive layer may be dry-etched or wet-etched.

Figure 4:
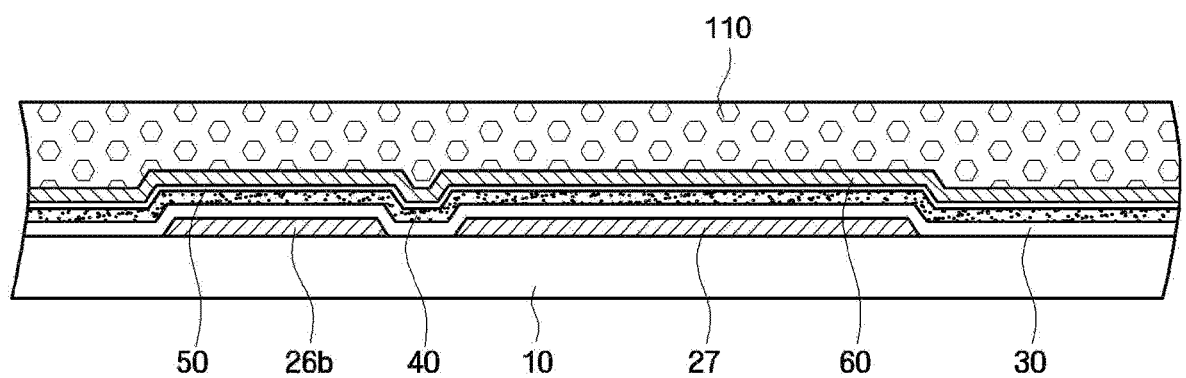

Referring to FIGS. 1 and 4, the gate insulating film 30, a semiconductor layer 40, and an ohmic contact material layer 50 are sequentially stacked on the gate line 22, the first gate electrode 26a, the second gate electrode 26b, and the light-shielding pattern 27. Here, the gate insulating film 30, the semiconductor layer 40, and the ohmic contact material layer 50 may be successively deposited by CVD.

Next, a data conductive layer 60 is formed on the ohmic contact material layer 50 by, e.g., sputtering, and then coated with photoresist 110.

Figure 5:
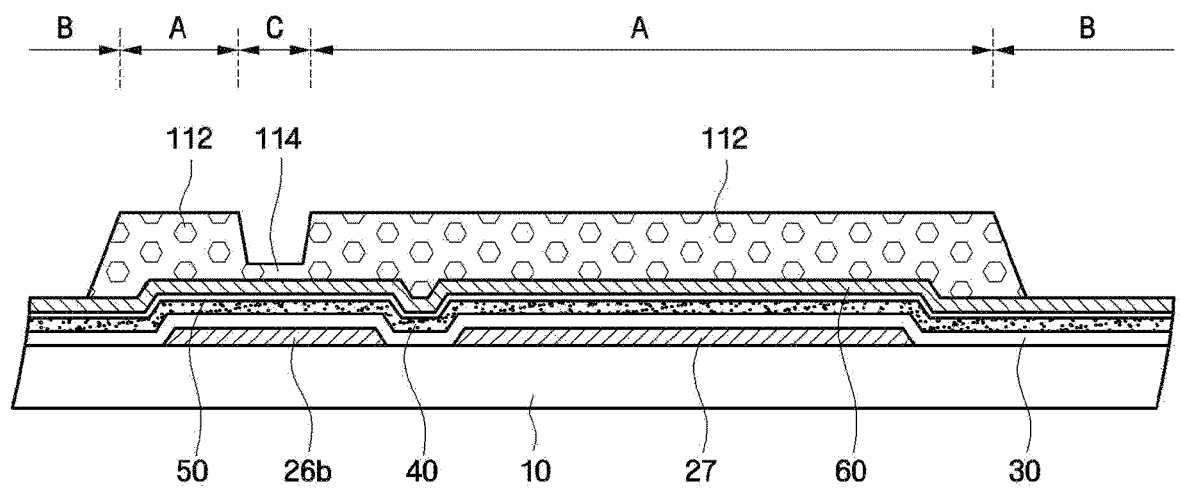

Referring to FIGS. 4 and 5, the photoresist 110 may be exposed to light using a mask and then developed to form photoresist patterns 112 and 114. Here, the photoresist pattern 114 disposed in a channel region C of a TFT is formed thinner than the photoresist pattern 112 disposed in a data wiring region A. All photoresist 110 in a region B excluding the channel region C and the data wiring region A is removed. A ratio of a thickness of the photoresist pattern 114 remaining in the channel region C to a thickness of the photoresist pattern 112 remaining in the data wiring region A may vary according to processing conditions of an etching process which will be described later.

Figure 6:
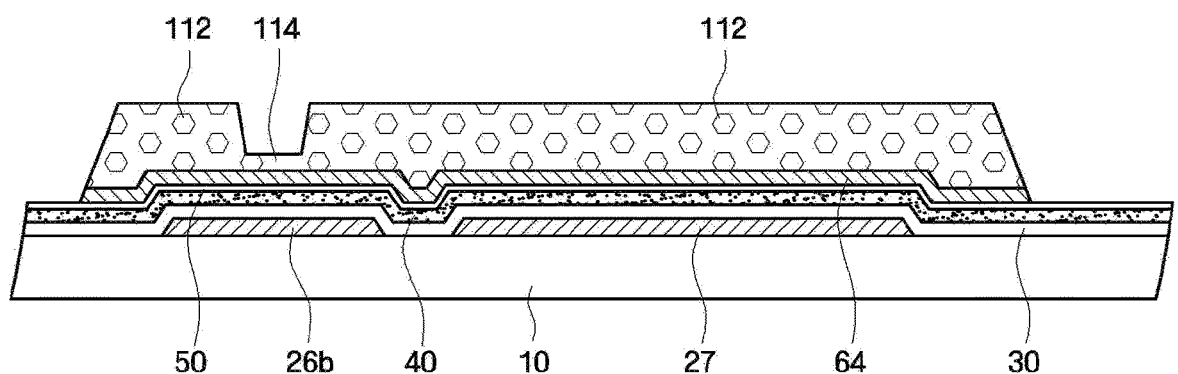

Referring to FIGS. 5 and 6, the data conductive layer 60 is etched using the photoresist patterns 112 and 114 as an etch mask. Here, the data conductive layer 60 may be dry-etched or wet-etched. After the data conductive layer 60 is etched, the data wirings are formed. In this case, since the channel region C is not etched, the data wirings are not separated into a source electrode and a drain electrode.

Figure 7:
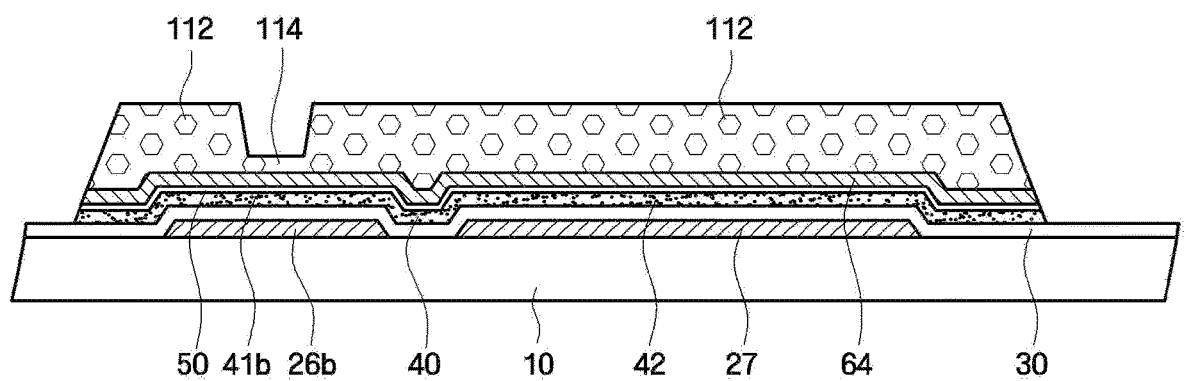

Referring to FIGS. 6 and 7, the ohmic contact material layer 50 and the semiconductor layer 40 may be patterned by a dry etching process using the photoresist patterns 112 and 114 as an etch mask. Here, the ohmic contact material layer 50 and the semiconductor layer 40 are patterned such that they are etched simultaneously while the gate insulating film 30 is not etched.

Figure 8:
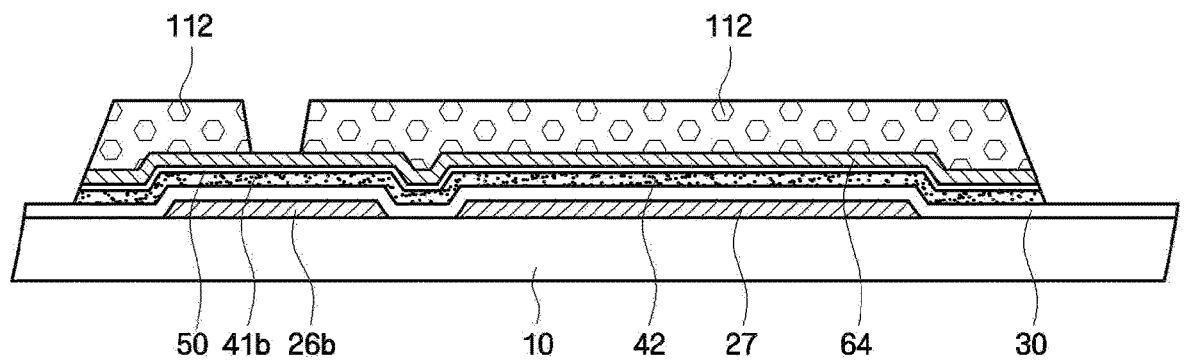

Referring to FIGS. 7 and 8, the photoresist patterns 112 and 114 are etched back to remove the photoresist pattern 114 in the channel region C. Then, the photoresist 110 remaining on a surface of a source/drain conductive film pattern 64 in the channel region C may be removed by an ashing process, for example.

Figure 9:
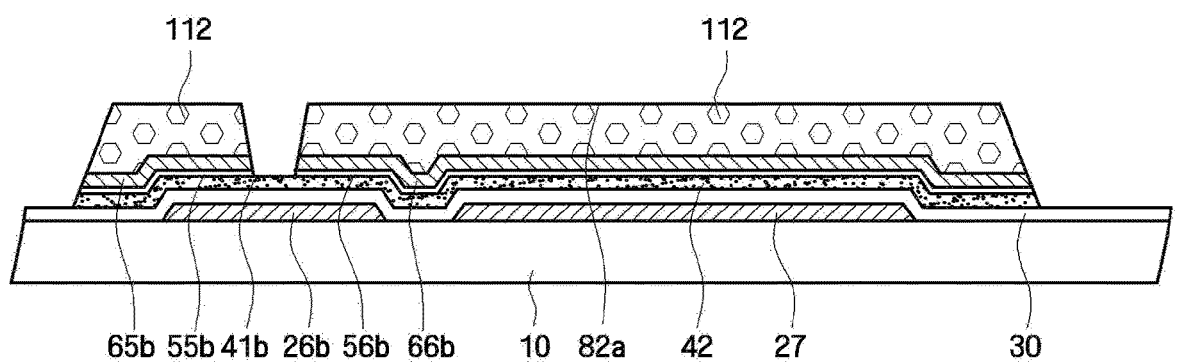

Referring to FIG. 9, the source/drain conductive film pattern 64 in the channel region C may be removed by the dry-etching process. Here, a chlorine (Cl)-based etching gas may be used.

Next, the ohmic contact material layer 50 in the channel region C may be removed by the dry-etching process. As a result, the second source electrode 65b and the second drain electrode 66b are separated from each other, thereby completing the data wirings and the ohmic contact layers 55b and 56b under the second source electrode 65b and the second drain electrode 66b, respectively.

Figure 10:
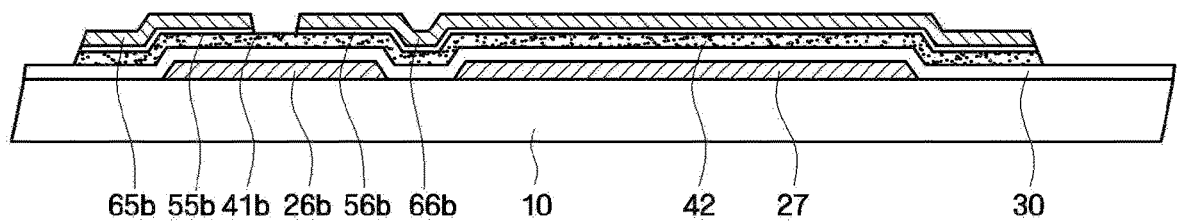

Referring to FIGS. 9 and 10, the photoresist pattern 112 remaining on the data wiring is removed.

Figure 11:
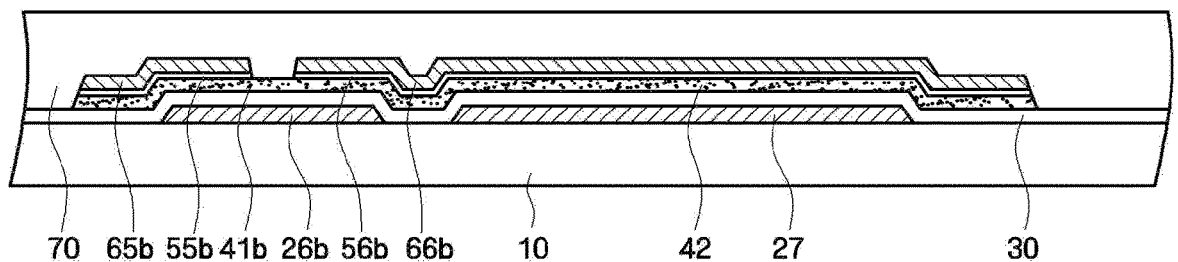

Referring to FIGS. 10 and 11, the passivation layer 70 is formed on the resultant structure of FIG. 10.

Figure 12:
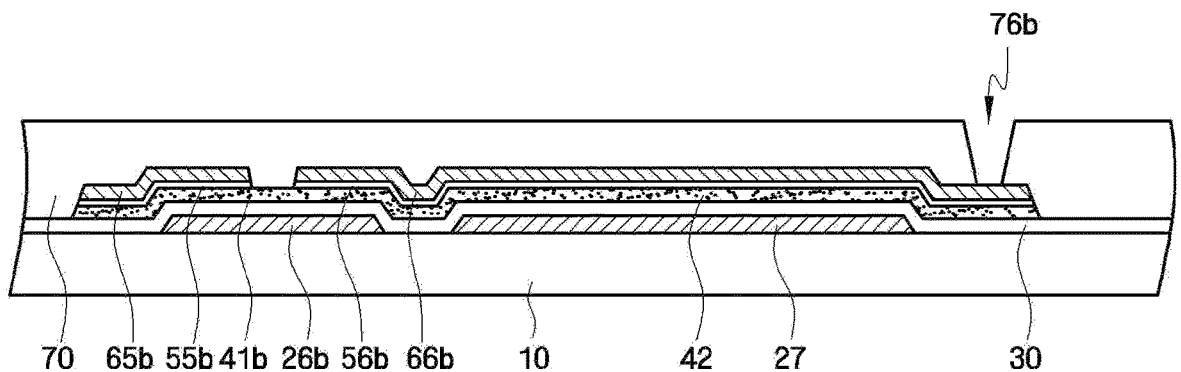

Referring to FIG. 12, the passivation layer 70 is etched to form the contact hole 76b.

Finally, referring to FIG. 2, a transparent conductor, such as ITO or IZO, is deposited on the passivation layer 70, and photolithography may be performed on the transparent conductor to form the first and second subpixel electrodes 82a and 82b.

The method of fabricating the TFT panel 100 according to the first embodiment of the present invention may also be applied to an array-on-color filter (AOC) structure in which a TFT array is formed on a color filter.

Figure 13:
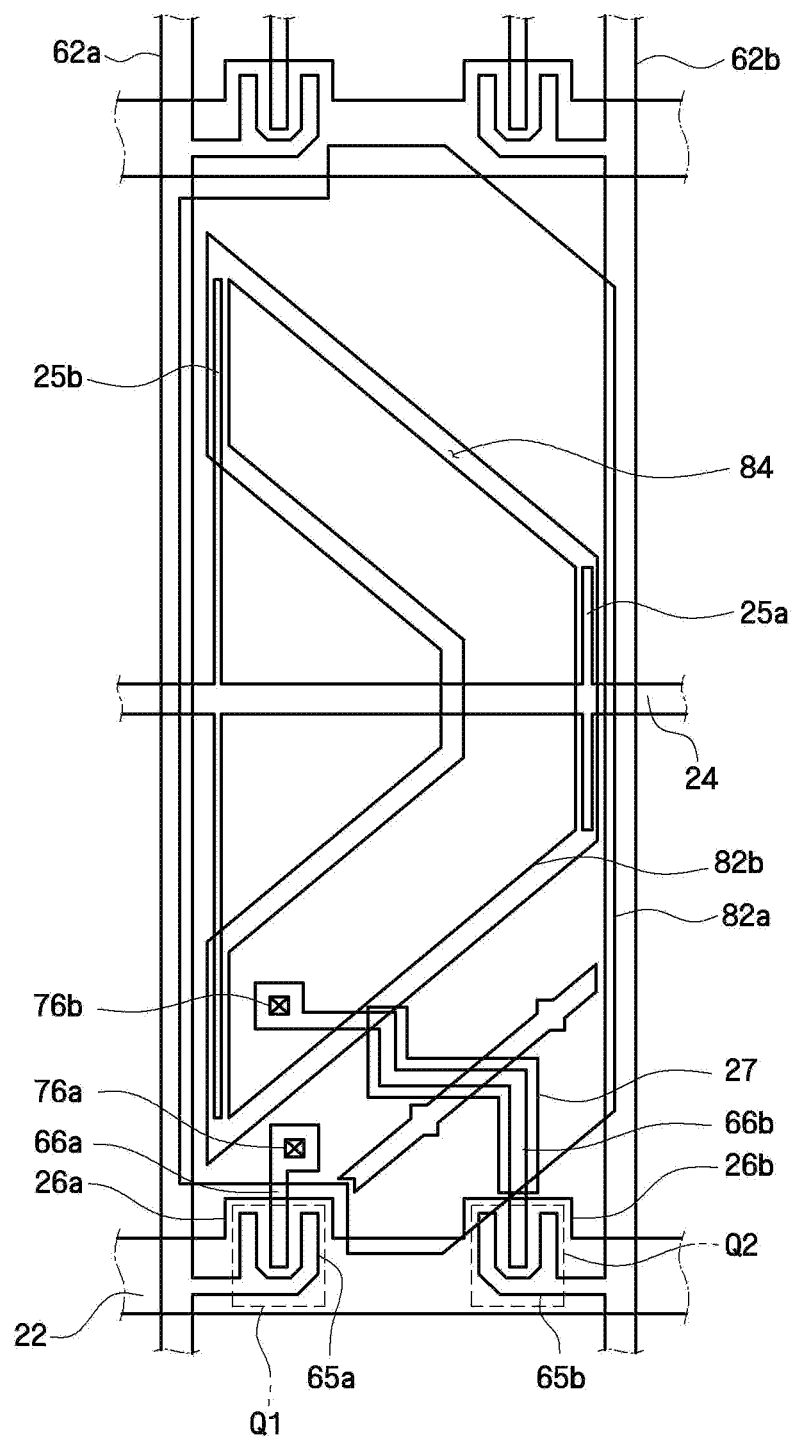
FIG. 13 is a layout diagram of a TFT panel according to a second embodiment of the present invention.

Hereinafter, a TFT panel according to a second embodiment of the present invention will be described in detail with reference to FIG. 13. FIG. 13 is a layout diagram of the TFT panel according to the second embodiment of the present invention. For simplicity, elements substantially identical to those of the first embodiment are indicated by like reference numerals, and thus their description will be omitted. In the TFT panel according to the second embodiment of the present invention, a second decoupling electrode 25b is formed between a second subpixel electrode 82b, to which a relatively high voltage is applied, and a first data line 62a, and a first decoupling electrode 25a is formed between the second subpixel electrode 82b and a second data line 62b.

Specifically, a decoupling line 24 extends across a first subpixel electrode 82a and the second subpixel electrode 82b to be substantially parallel to a gate line 22. The decoupling line 24 delivers a decoupling voltage to each of the first and second decoupling electrodes 25a and 25b. Here, the decoupling voltage may be a common voltage.

The first decoupling electrode 25a and the second decoupling electrode 25b prevent coupling between the second subpixel electrode 82b and the first and second data lines 62a and 62b. The first and second decoupling electrodes 25a and 25b are disposed between the second subpixel electrode 82b and the first and second data lines 62a and 62b to be parallel to the first and second data lines 62a and 62b.

The second subpixel electrode 82b may receive a relatively higher voltage than a voltage applied to the first subpixel electrode 82a and represent a high gray-level region of a pixel. Here, the effect of the high gray-level region on luminance is relatively great. Thus, if the second subpixel electrode 82b is coupled to the first and second data lines 62a and 62b, it greatly affects the change in luminance. For this reason, the first and second decoupling electrodes 25a and 25b may be formed to prevent the coupling between the second subpixel electrode 82b and the first and second data lines 62a and 62b.

The first and second decoupling electrodes 25a and 25b may also prevent leakage of light between the first subpixel electrode 82a, the second subpixel electrode 82b, the first data line 62a, and the second data line 62b.

The first and second decoupling electrodes 25a and 25b may partially overlap the first subpixel electrode 82a, the second subpixel electrode 82b, the first data line 62a, or the second data line 62b. For example, since a semiconductor pattern 42 is formed between the first and second data lines 62a and 62b and a first insulating substrate 10, the first and second decoupling electrodes 25a and 25b may be formed to overlap the first and second data lines 62a and 62b in order to prevent the semiconductor pattern 42 from becoming conductive due to light. The first and second decoupling electrodes 25a and 25b may be formed together in the same plane as the gate line 22.

The first and second decoupling electrode 25a and 25b may reduce the difference between the coupling capacitance of the second subpixel electrode 82b and the first data line 62a and that of the second subpixel electrode 82b and the second data line 62b.

Figure 14:
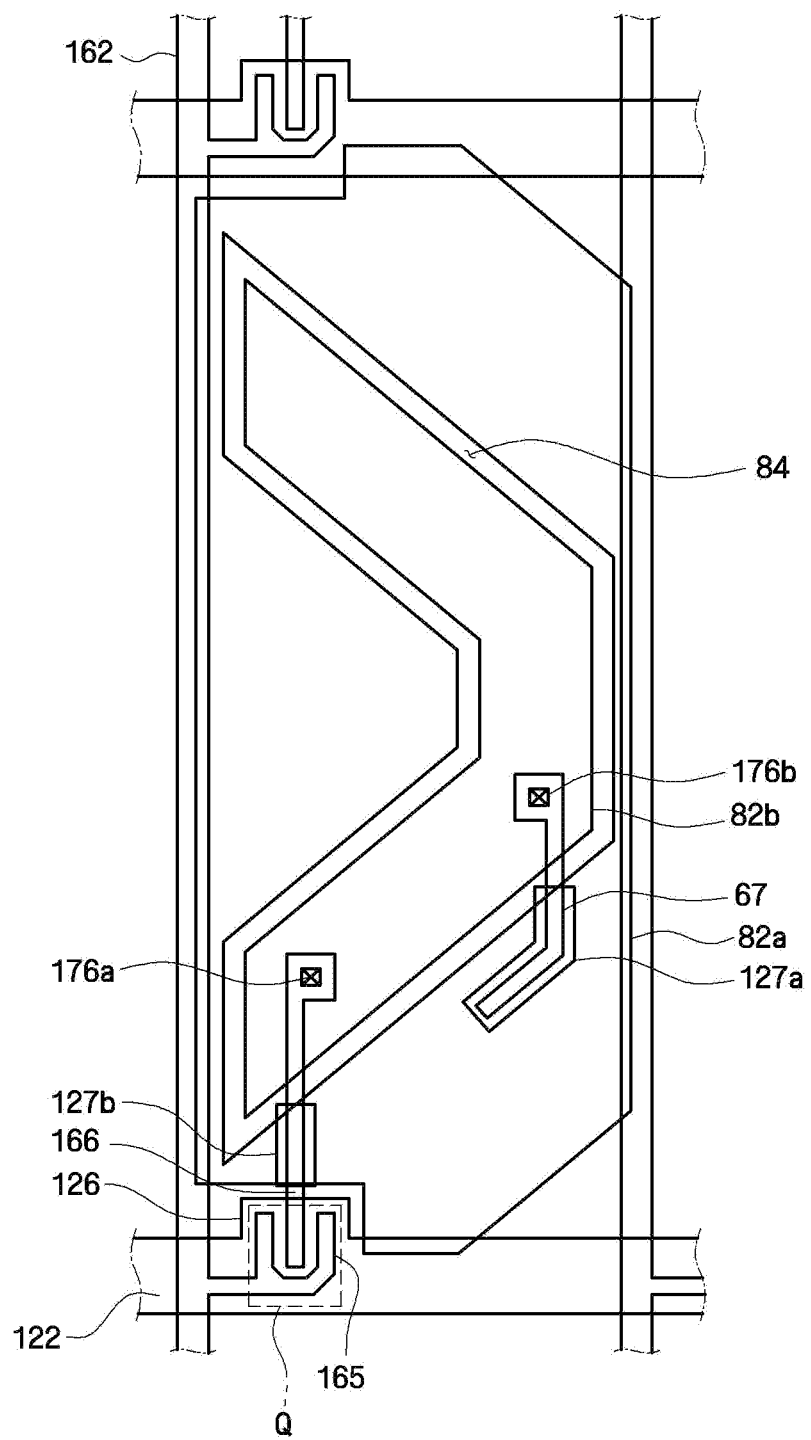
FIG. 14 is a layout diagram of a TFT panel according to a third embodiment of the present invention.

Hereinafter, a TFT panel according to a third embodiment of the present invention will be described in detail with reference to FIG. 14. FIG. 14 is a layout diagram of the TFT panel according to the third embodiment of the present invention. For simplicity, elements substantially identical to those of the first embodiment are indicated by like reference numerals, and thus their description will be omitted.

In the TFT panel according to the third embodiment of the present invention, a first subpixel electrode 82a and a second subpixel electrode 82b are capacitively coupled to each other.

Specifically, a gate line 122 is formed on a first insulating substrate made of transparent glass and generally extends in the horizontal direction. One gate line 122 is allocated to each pixel, and a gate electrode 126 protrudes from the gate line 122.

A data line 162 is insulated from the gate line 122 and generally extends in the vertical direction. A TFT Q is formed in the gate line 122 and the data line 162.

The TFT Q includes the gate electrode 126, a source electrode 165, and a drain electrode 166 as its three terminals. The drain electrode 166 is connected to the second subpixel electrode 82b by a first contact hole 176a.

The first subpixel electrode 82a is separated from the second subpixel electrode 82b by a slit pattern 84 (i.e., a domain partition portion). Thus, the first and second subpixel electrodes 82a and 82b are electrically insulated from each other and engage with each other in a predetermined shape to form a pixel region. The second subpixel electrode 82b is connected to the TFT Q and receives a data voltage directly from the TFT Q. The first subpixel electrode 82a receives a lower voltage than the voltage applied to the second subpixel electrode 82b due to a coupling capacitor of the second subpixel electrode 82b and a connecting electrode 67.

The first and second subpixel electrodes 82a and 82b are coupled to each other to act. That is, the connecting electrode 67, which is connected to the first subpixel electrode 82a, and the second subpixel electrode 82b are insulated from each other by a dielectric substance therebetween and overlap each other to form a "coupling capacitor." Therefore, when a data voltage is applied to the second subpixel electrode 82b, a voltage lower than the data voltage applied to the second subpixel electrode 82b is applied to the first subpixel electrode 82a.

The connecting electrode 67 is not necessarily connected to the second subpixel electrode 82b That is, the connecting electrode 67 may also be connected to the first subpixel electrode 82a. In this case, when the connecting electrode 67, which is connected to the first subpixel electrode 82a, and the second subpixel electrode 82b overlap each other to form a "coupling capacitor," if a data voltage is applied to the first subpixel electrode 82a, a lower voltage than the data voltage applied to the first subpixel electrode 82a may be applied to the second subpixel electrode 82b.

A semiconductor pattern (not shown) is formed under the connecting electrode 67 and data wirings. In order to eliminate the above-mentioned effects caused by the semiconductor pattern, light-shielding patterns 127a and 127b may be formed under a semiconductor layer which is overlapped by the connecting electrode 67 and the drain electrode 166. The light-shielding patterns 127a and 127b may be formed under the connecting electrode 67 and the drain electrode 166 which is overlapped by the first subpixel electrode 82a.

Figure 15:
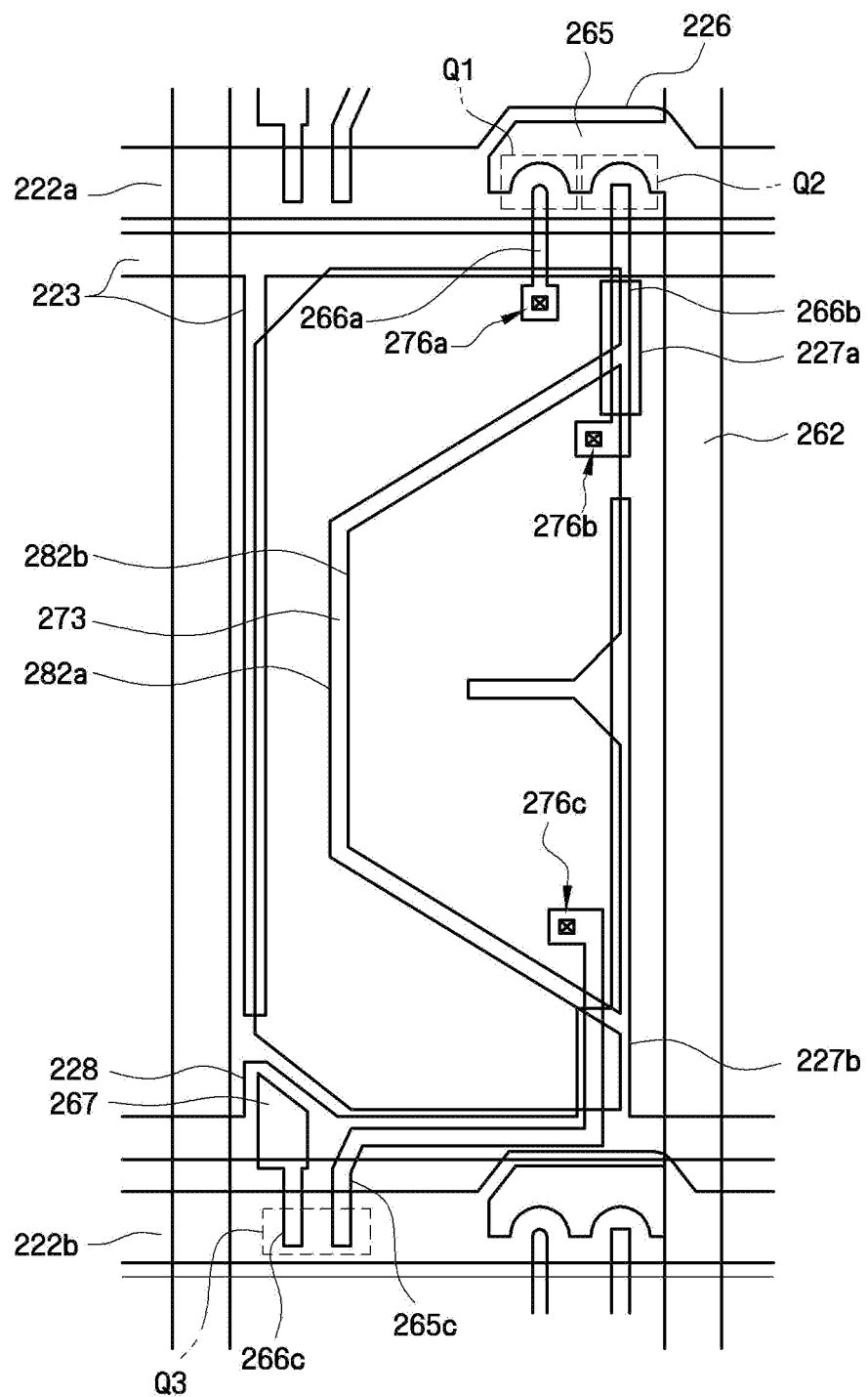
FIG. 15 is a layout diagram of a TFT panel according to a fourth embodiment of the present invention.

Hereinafter, a TFT panel according to a fourth embodiment of the present invention will be described in detail with reference to FIG. 15. FIG. 15 is a layout diagram of the TFT panel according to the fourth embodiment of the present invention. For simplicity, elements substantially identical to those of the first embodiment are indicated by like reference numerals, and thus their description will be omitted.

Referring to FIG. 15, the TFT panel according to the fourth embodiment of the present invention includes three TFTs Q1 through Q3 and two subpixel electrodes 282a and 282b. The first TFT Q1 drives the first subpixel electrode 282a, and the second TFT Q2 drives the second subpixel electrode 282b. The third TFT Q3 is connected to the second subpixel electrode 282b and a control electrode 267 and thus changes a voltage applied to the second subpixel electrode 282b.

The TFT panel includes a first gate line 222a and a second gate line 222b which are formed on a first insulating substrate and extend in the horizontal direction to be parallel to each other. The TFT panel further includes a data line 262 which crosses the first and second gate lines 222a and 222b.

The first gate line 222a and the second gate line 222b include a first gate electrode 226 and a second gate electrode, respectively.

A first source electrode 265 corresponds to respective input terminals of the first and second TFTs Q1 and Q2. The first source electrode 265 branches off from the data line 262 and is disposed on the first gate electrode 226. The first and second TFTs Q1 and Q2 are switched on or off by the first gate line 222a.

A second source electrode 265c corresponds to an input terminal of the third TFT Q3 and is disposed on the second gate line 222b. The second source electrode 265c is connected to the second subpixel electrode 282b by a third contact hole 276c.

A first drain electrode 266a is electrically connected to the first subpixel electrode 282a by a first contact hole 276a. A second drain electrode 266b is electrically connected to the second subpixel electrode 282b by a second contact hole 276b. A third drain electrode 266c is connected to the control electrode 267.

The control electrode 267 overlaps a storage line 228 to form a control capacitor. Here, the storage line 228 extends parallel to the first and second gate lines 222a and 222b. The control electrode 267 and the storage line 228 may be overlapped by a black matrix (not shown). The control electrode 267 may be formed in the same plane and at the same time as the first and second drain electrodes 266a and 266b. Also, the storage line 228 may be formed in the same plane and at the same time as the first and second gate lines 222a and 222b.

The first and second subpixel electrodes 282a and 282b are separated from each other by a slit pattern 273 which is a domain formation portion. The domain formation portion is not limited to the slit pattern 273 and may be a protrusion pattern.

A pixel includes the first and second gate lines 222a and 222b which extend parallel to each other and the data line 272 which crosses the first and second gate lines 222a and 222b. In addition, the pixel includes three TFTs Q1 through Q3. The first gate electrode 226 of the first and second TFTs Q1 and Q2 is connected to the first gate line 222a, and the third TFT Q3 is formed on the second gate line 222b. The second gate line 222b may be formed as a separate, independent line or may be connected to a gate electrode of a first TFT (not shown) and a second TFT (not shown) of an adjacent pixel.

While the input terminals of the first and second TFTs Q1 and Q2 are connected to the data line 262, the input terminal of the third TFT Q3 is connected to an output terminal of the second TFT Q2. The output terminals of the first and second TFTs Q1 and Q2 are connected respectively to the first and second subpixel electrodes 282a and 282b to apply predetermined voltages to a liquid crystal layer. That is, the first TFT Q1 is connected to the first subpixel electrode 282a to form a first liquid crystal capacitor, and the second TFT Q2 is connected to the second subpixel electrode 282b to form a second liquid crystal capacitor.

The input terminal of the third TFT Q3 is connected to the second subpixel electrode 282b which is the output terminal of the second TF Q2, and the output terminal thereof is connected to the control electrode 267 to form a control capacitor together with the storage line 228. A common voltage may be applied to the storage line 228.

A decoupling electrode 223 may be formed to prevent the coupling between the first or second subpixel electrode 282a or 282b and the data line 262. The decoupling electrode 223 may partially overlap the first or second subpixel electrode 282a or 282b to function as a storage electrode.

Light-shielding patterns 227a and 227b may be formed under the second drain electrode 266b and the second source electrode 265c, respectively. The light-shielding patterns 227a and 227b may be formed in the same plane as the first and second gate lines 222a and 222b and block light. The light-shielding pattern 227a is formed in a region where the second drain electrode 266b is overlapped by the first subpixel electrode 282a and in a region where the second source electrode 265c is overlapped by the first subpixel electrode 282a. The light-shielding pattern 227b may be connected to the storage line 228 or may float.

To charge the first and second subpixel electrodes 282a and 282b with voltages, the first and second TFTs Q1 and Q2 are turned on. Accordingly, the first and second liquid crystal capacitors are formed between the first and second subpixel electrodes 282a and 282b and a common electrode (not shown). Then, when the third TFT Q3 is turned on, a voltage applied to the second liquid crystal capacitor is changed by the control capacitor. As a result, there occurs a difference between the voltage of the first liquid crystal capacitor and that of the second liquid crystal capacitor.

Figure 16:
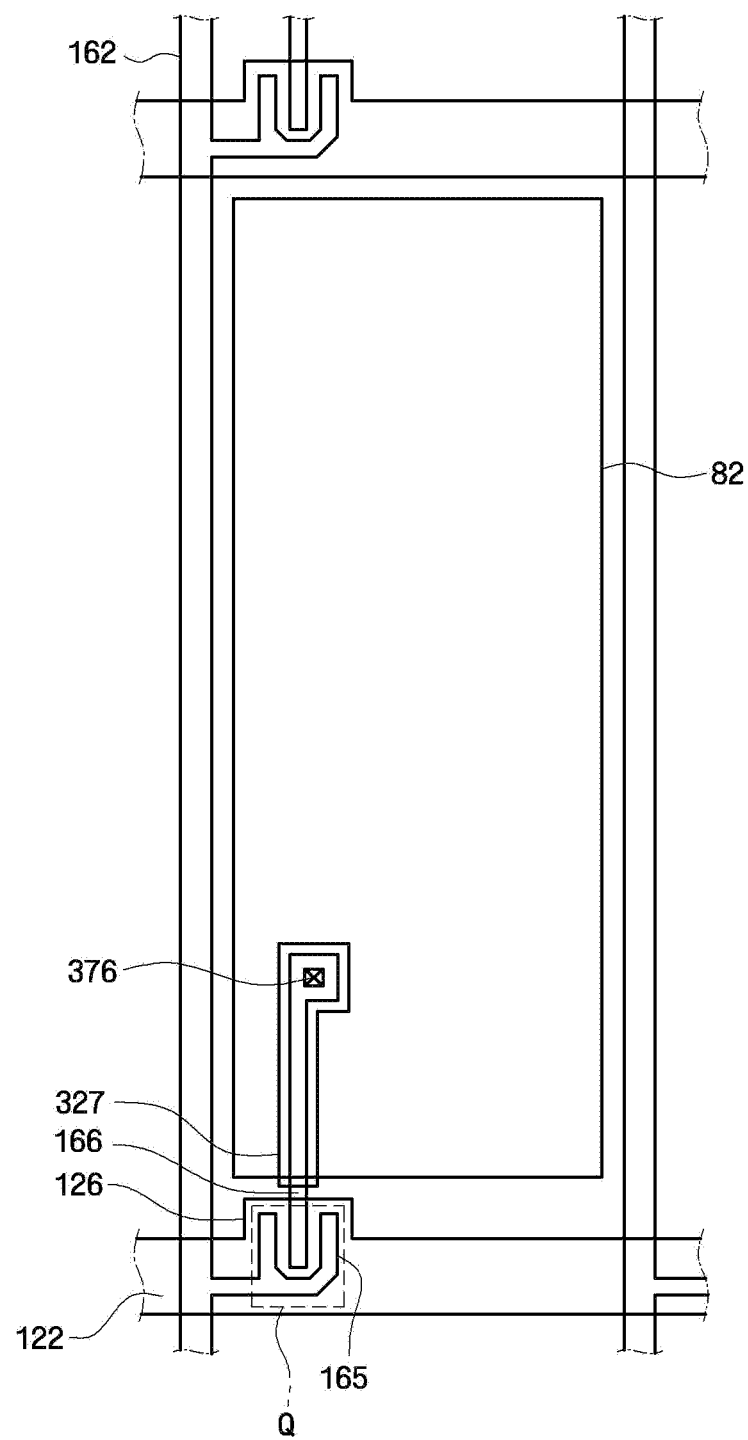
FIG. 16 is a layout diagram of a TFT panel according to a fifth embodiment of the present invention.

Hereinafter, a TFT panel according to a fifth embodiment of the present invention will be described in detail with reference to FIG. 16. FIG. 16 is a layout diagram of the TFT panel according to the fifth embodiment of the present invention. For simplicity, elements substantially identical to those of the first embodiment are indicated by like reference numerals, and thus their description will be omitted.

In the TFT panel according to the fifth embodiment of the present invention, a pixel includes a TFT Q and a pixel electrode 82.

The TFT panel includes a gate line 122 which is formed on a first insulating substrate and extends in the horizontal direction to be parallel to an adjacent gate line. The TFT panel further includes a data line 162 crossing the gate line 122. The gate line 122 includes a gate electrode 126.

A source electrode 165 corresponds to an input terminal of the TFT Q, branches off from the data line 162, and is disposed on the gate electrode 126.

A drain electrode 166 is electrically connected to the pixel electrode 82 by a contact hole 376.

A light-shielding pattern 327 may be formed under the drain electrode 166. The light-shielding pattern 327 and the gate line 122 are formed in the same plane by the same process. The light-shielding pattern 327 blocks light.

The light-shielding pattern 327 is formed in a region where the drain electrode 166 is overlapped by the pixel electrode 82. The light-shielding pattern 327 may float, or a DC voltage may be applied to the light-shielding pattern 327.

While the present disclosure has been particularly shown and described with reference to exemplary embodiments thereof, it will be understood by those of ordinary skill in the art that various changes in form and detail may be made therein without departing from the spirit and scope of the present disclosure as defined by the following claims. The exemplary embodiments should be considered in a descriptive sense only and not for purposes of limitation.

What is claimed is:

1. A thin-film transistor (TFT) panel comprising:
an insulating substrate;
a first TFT including:
a first gate line including a gate electrode formed on an upper surface of the insulating substrate,
a gate insulating layer formed on the gate electrode, the gate insulating layer including a lower surface facing the insulating substrate and an upper surface opposite to the lower surface,
a semiconductor layer formed on the upper surface of the gate insulating layer,
a first data line having a source electrode that overlaps the semiconductor layer, and
a drain electrode comprising a first end, and a second end wherein the first end of the drain electrode overlaps the semiconductor layer,
a first subpixel electrode formed on the insulating substrate, wherein the second end of the drain electrode is connected to the first subpixel electrode via a contact hole;
a light-shielding pattern that is separate and distinct from the gate electrode and the first gate line;
a second TFT: and
a second subpixel electrode electrically connected to the second TFT,
wherein a channel is formed between the source electrode and the drain electrode;
wherein the drain electrode is disposed between the light-shielding pattern and the pixel electrode,
wherein an area of the drain electrode, that is disposed between and separate from the first end and the second end of the drain electrode, overlaps the light-shielding pattern and is overlapped by the second subpixel electrode,
wherein the semiconductor layer is disposed between the light-shielding pattern and the drain electrode,
wherein the light-shielding pattern and the first gate line are disposed directly on the upper surface of the insulating substrate,
wherein the light-shielding pattern and the first gate line directly contact the lower surface of the gate insulating layer,
wherein the semiconductor layer directly contacts the upper surface of the gate insulating layer, and
wherein the gate electrode, the first gate line, and the light-shielding pattern are made of a same material.

2. The panel of claim 1, wherein the light-shielding pattern and the first gate line are both disposed between the insulating substrate and the gate insulating layer.

* * * * *